United States Patent [19]
Kamon

[11] Patent Number: 5,315,349
[45] Date of Patent: May 24, 1994

[54] PROJECTION ALIGNER
[75] Inventor: Kazuya Kamon, Itami, Japan
[73] Assignee: Mitsubishi Denki Kabushiki Kaisha, Tokyo, Japan
[21] Appl. No.: 974,077
[22] Filed: Nov. 10, 1992
[30] Foreign Application Priority Data
Jan. 21, 1992 [JP] Japan .................................. 4-008311
[51] Int. Cl.⁵ .............................................. G03B 27/68
[52] U.S. Cl. ...................................... 355/53; 355/125; 355/71
[58] Field of Search .......................... 355/53, 125, 71
[56] References Cited
U.S. PATENT DOCUMENTS
5,008,702 4/1991 Tanaka et al. ........................ 355/52
5,117,254 5/1992 Kawashima et al. ................ 355/43

Primary Examiner—Richard A. Wintercorn
Assistant Examiner—D. P. Malley
Attorney, Agent, or Firm—Leydig, Voit & Mayer

[57] ABSTRACT

A projection aligner includes a light source for emitting light, a mask including a focusing pattern and a condensing lens for condensing the light on the mask. Light-intercepting members and light-transmitting portions are alternately arranged in the focusing pattern. The projecting aligner includes a projecting lens for condensing the light on a surface of a wafer and a sensor for measuring the amount of the light transmitted through the focusing pattern after the light has passed through the focusing pattern on the mask and been reflected from the surface of the wafer.

4 Claims, 10 Drawing Sheets

PROJECTION ALIGNER

BACKGROUND OF THE INVENTION

1. Field of the Invention

The present invention relates to a projection aligner for use in the process of manufacturing LSIs.

2. Description of the Related Art

FIG. 11 shows the optical system of a conventional projection aligner. Light emitted from a light source 11, such as a mercury lamp, passes through a condensing lens 12 and then irradiates a mask 13 on which a circuit pattern is formed. The light which has passed through the mask 13 projects the circuit pattern onto a wafer 15, whereby the circuit pattern is exposed and then transferred.

Before the circuit pattern is exposed, the conditions under which a pattern is focused completely (hereinafter referred to as best focus conditions) must be determined. In a conventional exposure process, the best focus conditions are determined in the following manner. First, test patterns 16a to 16g as shown in FIG. 12 are successively exposed on the wafer 15 while the wafer 15 is moved along the optical axis at predetermined intervals. The wafer 15 is then developed. As shown in FIG. 13, patterns 17a to 17g corresponding to the test patterns 16a to 16g are formed on the wafer 15, and then observed with a microscope. Of the patterns 17a to 17g, the pattern having the best shape is found. The conditions under which such a pattern is formed are regarded as the best focus conditions. The circuit pattern is exposed under the best focus conditions. Of the patterns 17a to 17g shown in FIG. 13, for example, pattern 17c is determined as a pattern formed under the best focus conditions.

With such a conventional projection aligner, as described above, in order to determine the best focus conditions, before the circuit pattern is exposed, it is necessary to expose the test patterns 16a to 16g, to develop the wafer 15 and observe the patterns 17a to 17g with a microscope, such as an optical or electron microscope, thus requiring a great deal of trouble and time.

SUMMARY OF THE INVENTION

The present invention has been made to solve the above problems. Accordingly, the object of this invention is to provide a projection aligner capable of easily and quickly determining best focus conditions.

In order to achieve the above object, according to this invention, there is provided a projection aligner comprising: a light source for emitting illuminating light; a mask on which a focusing pattern is formed, light-intercepting portions and light-transmitting portions being alternately arranged in the focusing pattern; a condensing lens for condensing a projecting lens for condensing the illuminating light that passed through the mask; on a surface of a wafer and a sensor for measuring the amount of the illuminating light being transmitted through the focusing pattern on the mask after it has passed through the focusing pattern on the mask and been reflected from the surface of the wafer.

DESCRIPTION OF THE PREFERRED EMBODIMENTS

The preferred embodiments of the present invention will be described below with reference to the accompanying drawings.

Figure 1:
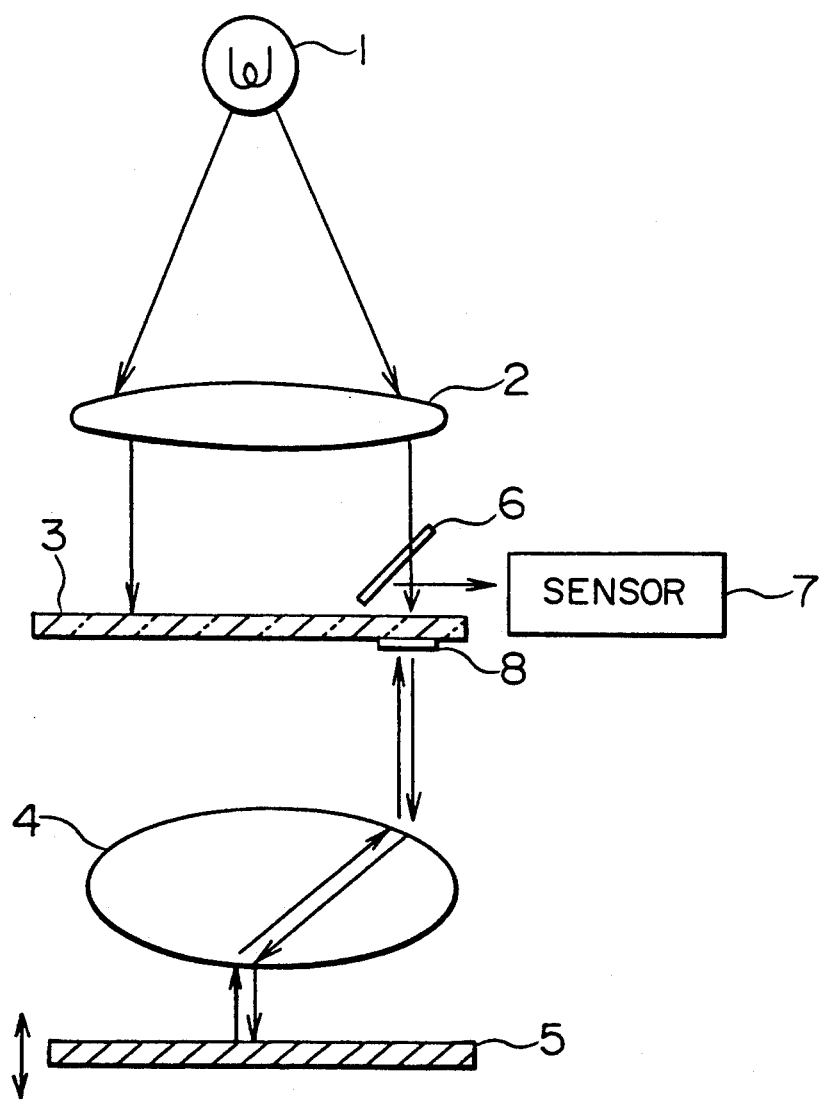
FIG. 1 is a view showing a projection aligner in accordance with an embodiment of the present invention.

FIG. 1 is a view showing the optical system of a projection aligner in accordance with an embodiment of this invention. A condensing lens 2 is disposed below a light source 1, such as a mercury lamp, and a mask 3 is disposed below the condensing lens 2. A projecting lens 4 is disposed below the mask 3, and a wafer 5 is disposed below the projecting lens 4. A pattern 8 for focusing the mask 3 is formed at the periphery of the mask 3. A half-mirror 6 is disposed between the condensing lens 2 and the mask 3 diagonally above the focusing pattern 8. A sensor is disposed by the side of the half-mirror 6.

Figure 2:
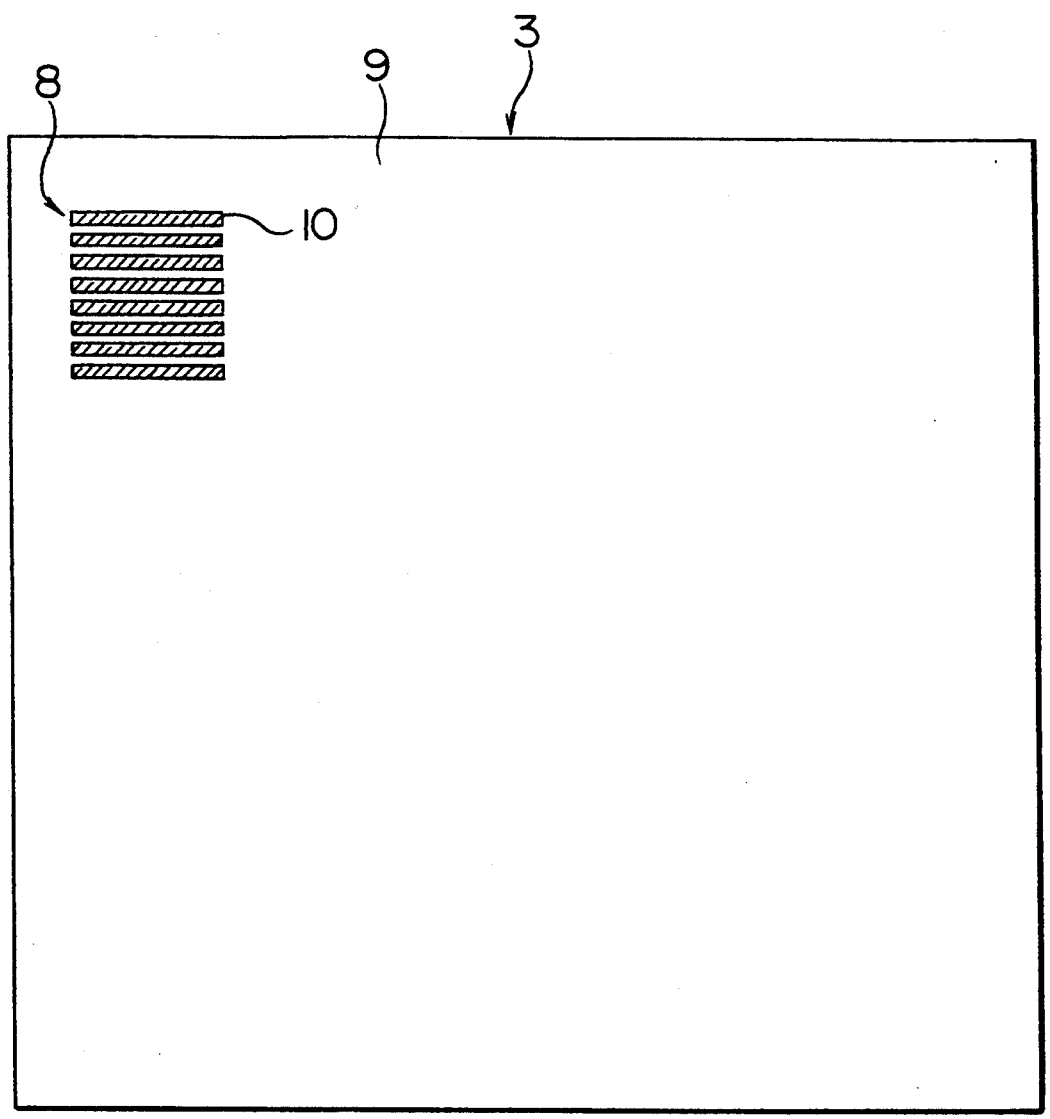
FIG. 2 is a plan view of a mask used in the embodiment.
Figure 3:
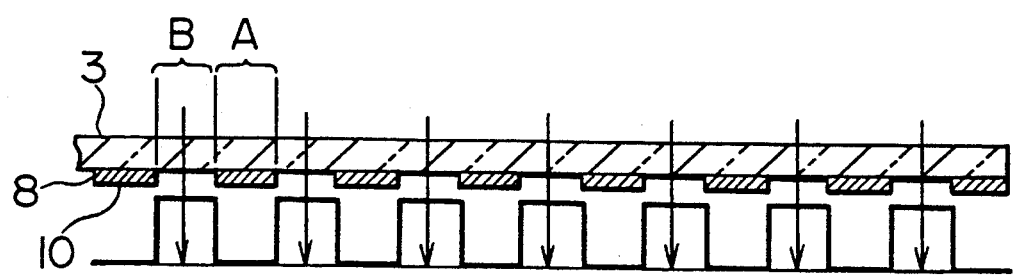
FIGS. 3 to 5 are views each showing the operation of the embodiment when light is focused completely.

As shown in FIG. 2, the mask 3 has a transparent substrate 9 on which a plurality of parallel light-intercepting members 10 having a fixed pitch are disposed. As shown in FIG. 3, because of the light-intercepting members 10, the focusing pattern 8 is formed in which light-intercepting portions A and light-transmitting portions B are alternatingly arranged.

In operation, illuminating light emitted from the light source 1 passes through the condensing lens 2 and then irradiates the mask 3. The light passes through the mask 3 and the projecting lens 4, and then impinges on the wafer 5. It is then reflected from the obverse surface of the wafer 5, passes through the projecting lens 4, and then again reaches the mask 3. Because of the half-mirror 6 disposed over the focusing pattern 8, the illuminating light, which has passed through the focusing pattern 8 and is reflected from the wafer 5, again passes through the focusing pattern 8, is reflected from the half-mirror 6, and then impinges on the sensor 7.

Figure 4:
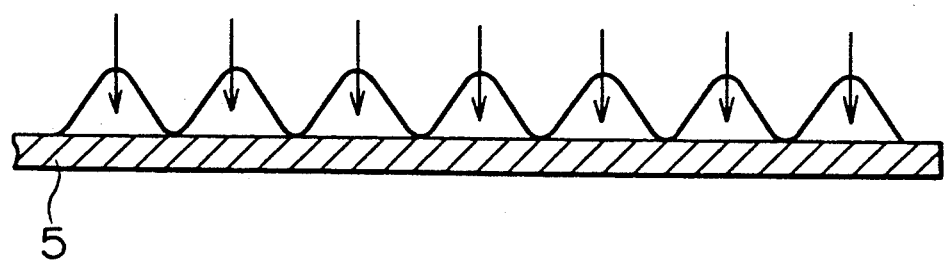
Figure 5:
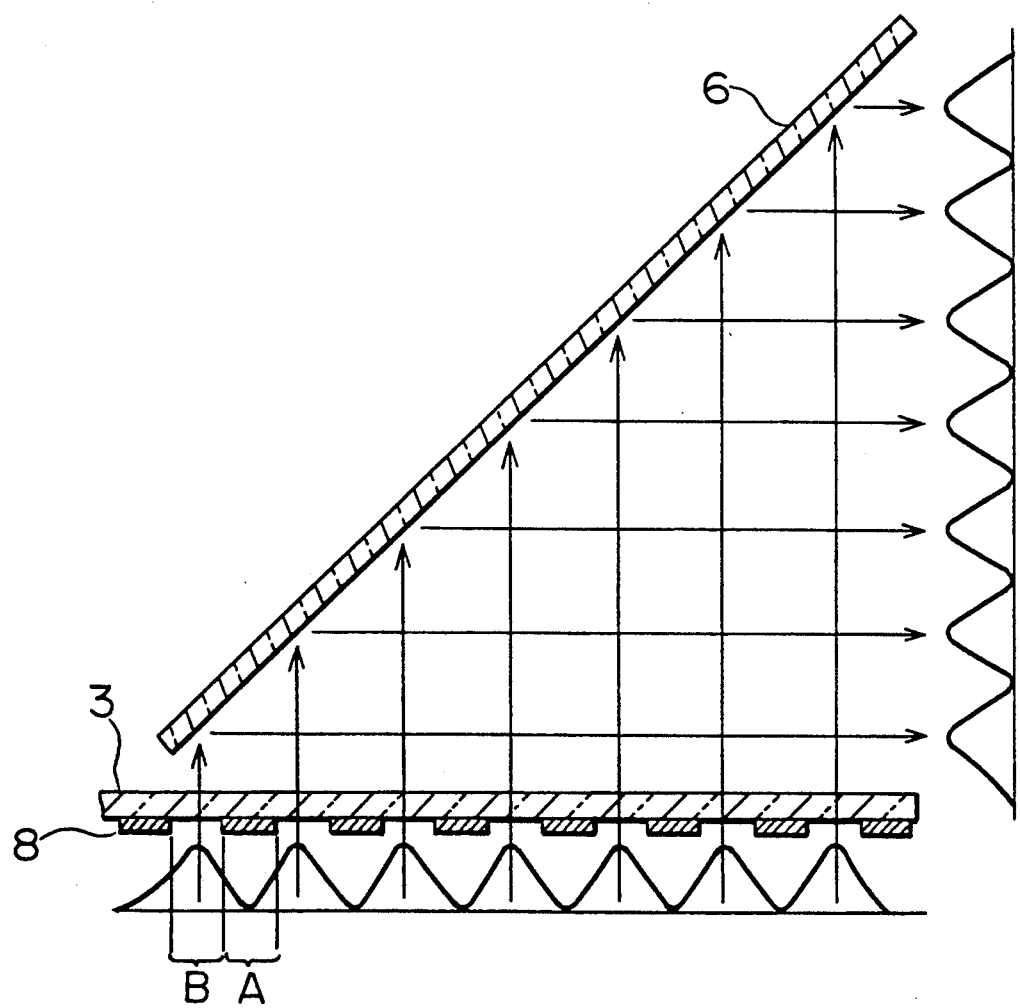

The illuminating light during the above operation will now be described in more detail with reference to FIGS. 3 to 8. As shown in FIG. 3, the illuminating light, which has just passed through the focusing pattern 8 on the mask 3, has a rectangular periodic amplitude distribution because of the light-intercepting portions A and the light-transmitting portions B alternatingly arranged. As shown in FIG. 4, when the light reaches the wafer 5 through the projecting lens 4, the shape of the amplitude distribution of the light is changed due to the diffraction of the light. As a result, the light has a sine wave amplitude distribution. However, where the light is focused completely, the amplitude of the sine wave increases as shown in FIG. 4. When the illuminating light is reflected from the obverse surface of the wafer 5 and reaches the focusing pattern 8 on the mask 3 after having a passed through the projecting lens 4 as shown in FIG. 5, the reflected light having sine distribution irradiates the focusing pattern 8 from underneath. When the light is focused completely, there is a slight change in the shape of the amplitude distribution of the reflected light. Therefore, the amount of light being transmitted through the light-transmitting portions B of the focusing pattern 8 increases, that is, the amount of light impinging on the sensor 7 through the half-mirror 6 increases.

Figure 6:
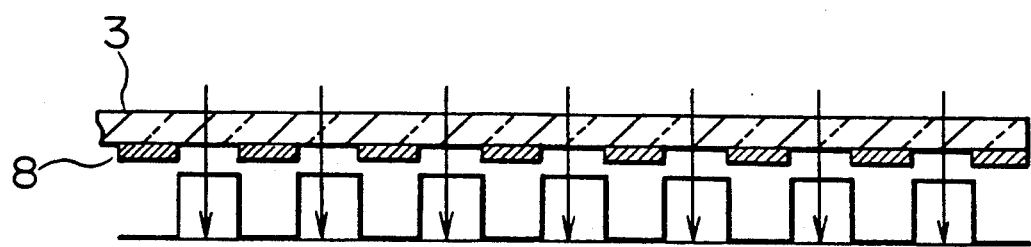
FIGS. 6 to 8 are views each showing the operation of the embodiment when the light is defocused.
Figure 7:
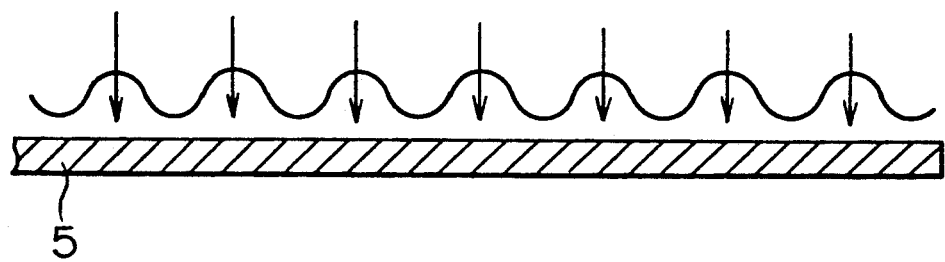
Figure 8:
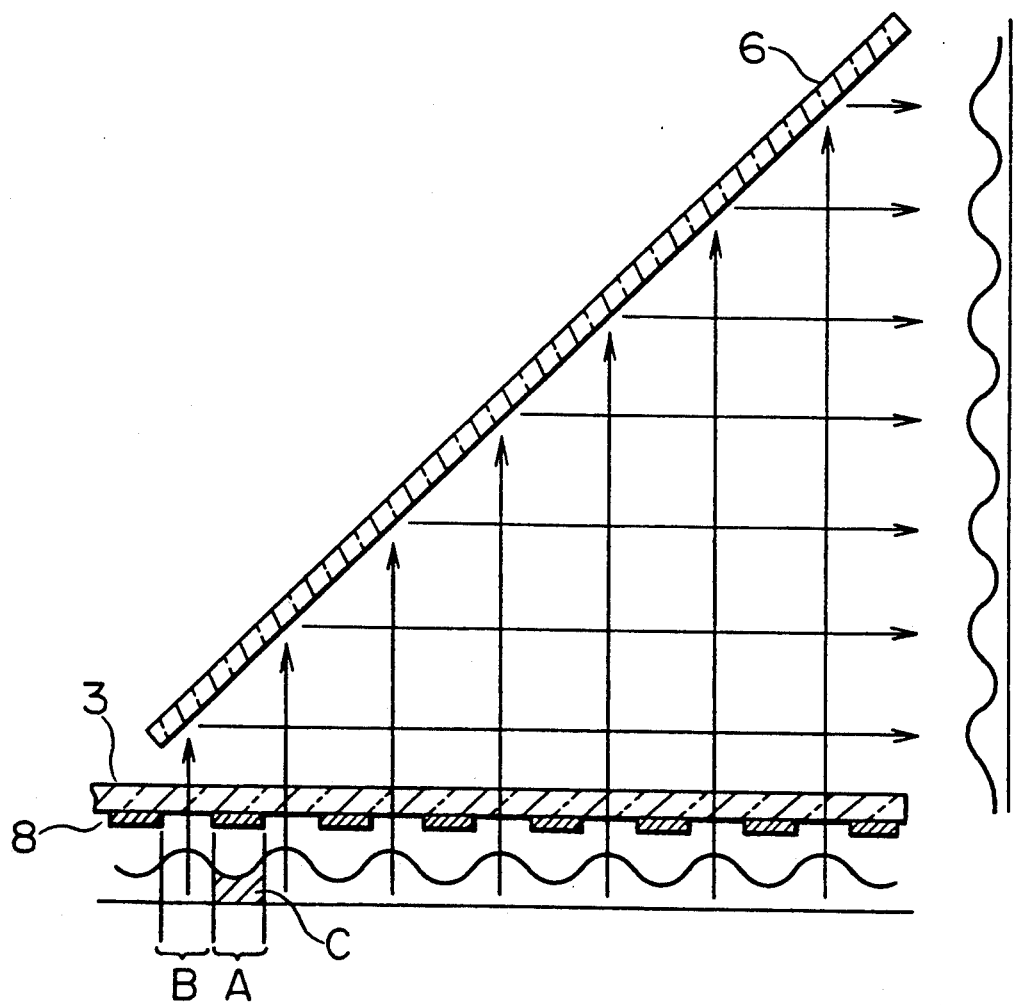

When the illuminating light is defocused, as shown in FIG. 6, the light, which has just passed through the focusing pattern 8 on the mask 3, has periodic rectangular amplitude distribution. As shown in FIG. 7, when the illuminating light reaches the wafer 5 through the projecting light 4, because the light is defocused, there is a greater change in the shape of the amplitude distribution of the illuminating light than when the light is focused completely. For this reason, when the light reflected from the wafer 5 again passes through the focusing pattern 8 on the mask 3, as indicated by a hatched portion C shown in FIG. 8, a large amount of light is intercepted by the light-intercepting portions A. As a result, the amount of light impinging on the sensor 7 through the half-mirror 6 is reduced.

In other words, the amount of light measured by the sensor 7 reaches a maximum when the light is focused completely. The more the light is defocused, the less the amount of light becomes. It is therefore possible to easily determine when the light is focused completely. This is made possible by monitoring the amount of light measured by the sensor 7 while the wafer 5 is being moved along the optical axis.

After the best focus conditions have thus been determined, an exposing mask on which a circuit pattern is formed is substituted for the mark 3, and then the circuit pattern is exposed. The focusing pattern 8 may be formed on a part of the exposing mask having the circuit pattern. In such a case, a check is made on whether the light is focused while the circuit pattern is being exposed. It is thus possible to continuously monitor fluctuations in focus attributable to certain factors, such as temperature, atmospheric pressure and the frequency of exposure, and to expose, at any time, the circuit pattern under the best focus conditions.

In the above embodiment, although the half-mirror 6 is disposed between the condensing lens 2 and the mask 3, this invention is not limited to such an arrangement. The half-mirror 6 may also be disposed closer to the light source 1 than to the mask 3. It may be disposed, for example, between the light source 1 and the condensing lens 2.

Figure 9:
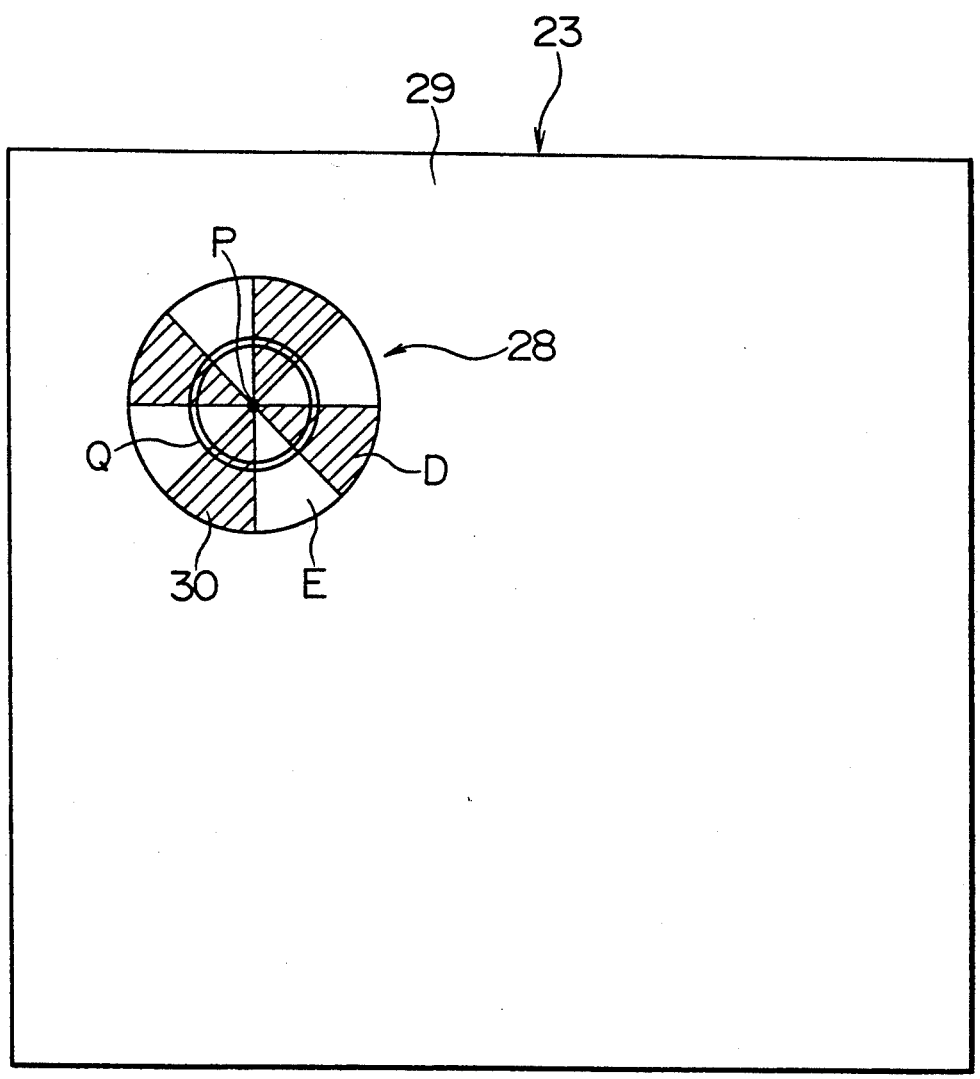
FIG. 9 is a plan view of a mask used in another embodiment.

A mask 23 as shown in FIG. 9 may also be used instead of the mask 3. The mask 23 has a transparent substrate 29. A plurality of light-intercepting members 30 are disposed in a sector extending from a point P of the transparent substrate 29 so that the members 30 subtend a fixed angle. Because of the light-intercepting members 30, a focusing pattern 28 is formed in which light-intercepting portions D and light-transmitting portions E are alternatingly arranged.

In the same manner as in the above embodiment, the sensor 7 measures the amount of illuminating light being transmitted through the focusing pattern 28 after having been reflected from the obverse surface of the wafer 5. This measurement makes it possible to easily determine the best focus conditions.

The effect of the diffraction of light depends on the wavelength of light and the size of each pattern. It is therefore possible to focus light with higher accuracy than in a conventional projection aligner when a focusing pattern is employed in which light-intercepting and light-transmitting portions are alternatingly arranged with the same pitch as the pitch of a circuit pattern to be exposed. The focusing pattern 28 shown in FIG. 9 has light-intercepting portions D and the light-transmitting portions E that subtend a fixed angle in a sector. If a circle is drawn around the point P, the pitch between the light-intercepting portions D and the light-transmitting portions E changes in accordance with the radius of the circle. In other words, if the radius increases, the pitch increases, whereas if the radius decreases, the pitch decreases. The focusing pattern 28 shown in FIG. 9 is formed into an image on a light-receiving surface of the sensor 7. Only an annular portion Q having an arbitrary radius of a circle drawn around the point P is used for measuring the amount of illuminating light. The amount of illuminating light being transmitted through the annular portion Q is measured. This measurement makes it possible to determine the best focus conditions where patterns are arranged with the desired pitch and therefore to focus the light with high accuracy.

Figure 10:
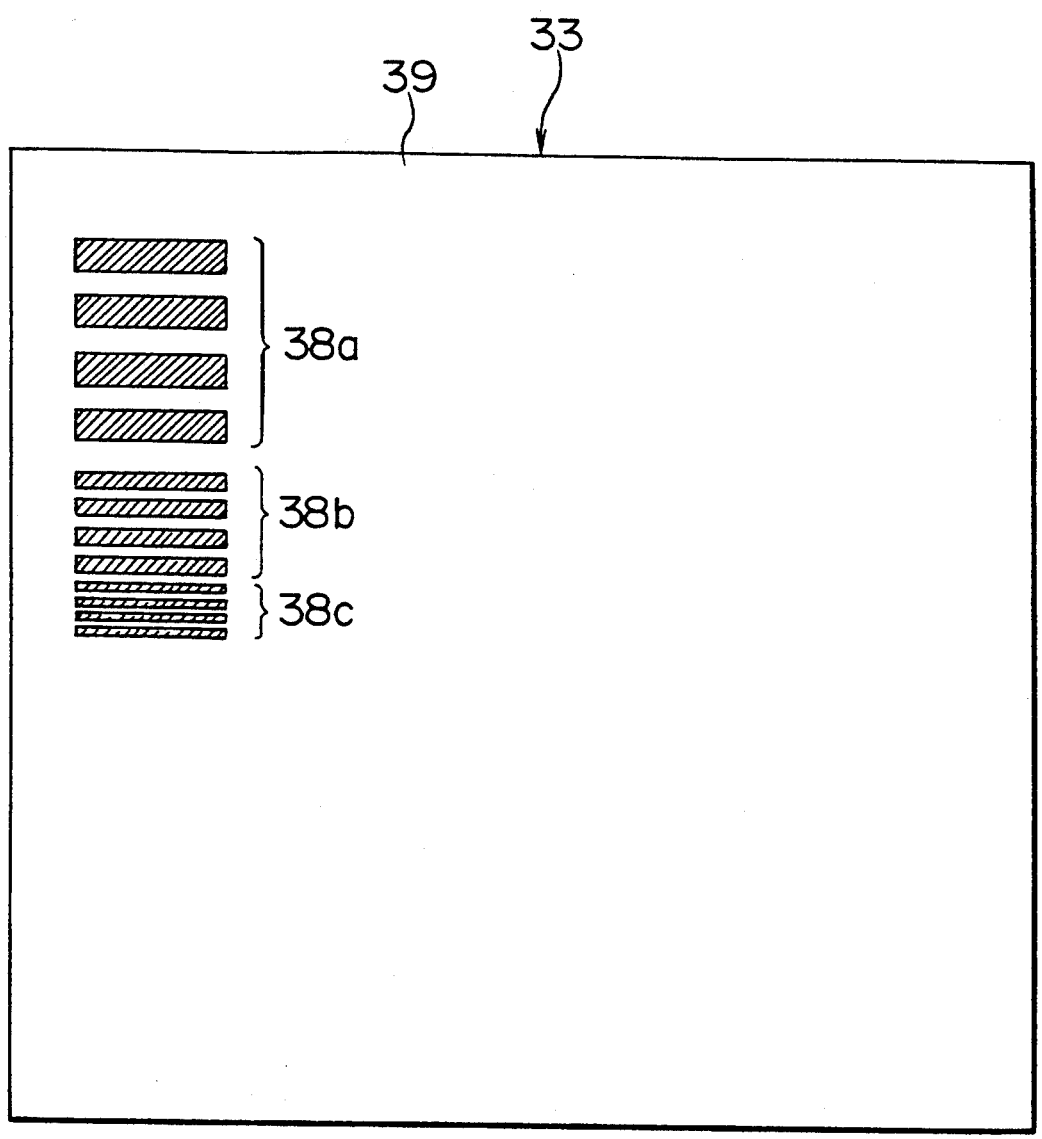
FIG. 10 is a plan view of a mask used in a further embodiment.
Figure 11:
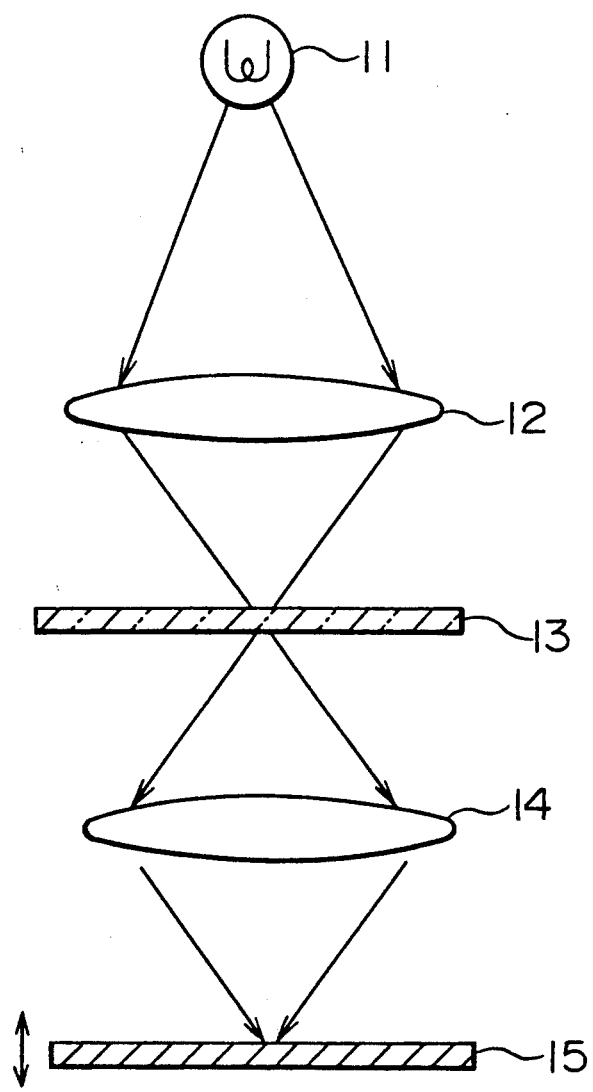
FIG. 11 is a view showing the optical system of the conventional projection aligner.
Figure 12:
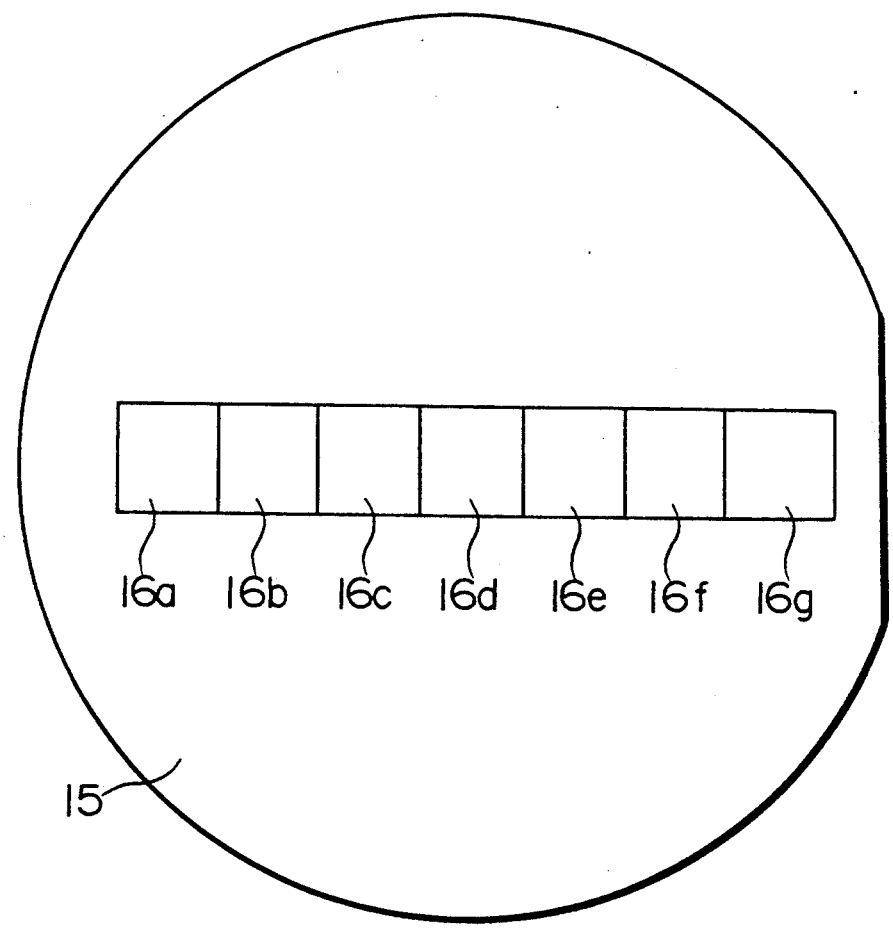
FIG. 12 is a plan view of a wafer showing how test patterns are exposed by a focusing method in the conventional projection aligner.
Figure 13:
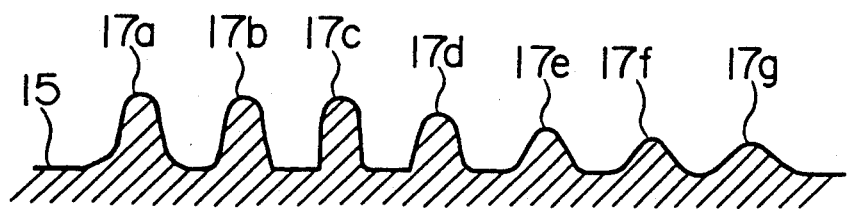
FIG. 13 is a sectional view of the test patterns formed on the wafer.

As shown in FIG. 10, it is possible to employ a mask 33 having a transparent substrate 39. A plurality of sets of focusing patterns 38a, 38b and 38c are located on the transparent substrate 39. Each set of patterns 38a, 38b and 38c has a plurality of parallel light-intercepting members arranged with a pitch specific to each pattern. A focusing pattern having a pitch most similar to those of a circuit pattern to be exposed is selected from the sets of focusing patterns 38a, 38b and 38c. It is thus possible to focus the light with high accuracy by measuring the amount of illuminating light being transmitted through the selected pattern.

What is claimed is:

1. A projection aligner comprising:
   a light source for emitting exposure light for exposing a photosensitive surface of a wafer;
   a mask including a focusing pattern having light-blocking members and light-transmitting portions alternatingly arranged;
   a condensing lens for condensing the exposure light onto said mask;
   a converging lens for condensing the exposure light passing through the mask including the focusing pattern to illuminate the photosensitive surface of the wafer and for transmitting the exposure light reflected from the photosensitive surface of the wafer to the mask including the focusing pattern;
   a half-mirror for reflecting exposure light transmitted through the light-transmitting portions of the focusing pattern of the mask after reflection from the photosensitive surface of the wafer, said half-mirror being disposed between said condensing lens and said mask; and
   a sensor for measuring the amount of the exposure light reflected from said half-mirror.

2. The projection aligner as claimed in claim 1 wherein the focusing pattern includes a plurality of rectangular light-blocking members and rectangular light-transmitting portions alternatingly arranged at a fixed pitch.

3. The projection aligner as claimed in claim 1 wherein the focusing pattern includes a plurality of patterns, each pattern including a plurality of rectangular light-blocking members and rectangular light-transmitting portions alternately arranged at a respective pitch in each pattern.

4. The projection aligner as claimed in claim 1 wherein the focusing pattern on said mask includes a plurality of light-blocking members and light-transmitting portions, said members and portions being radially alternately arranged in sectors extending from a center.

* * * * *